United States Patent [19]
Tanitsu et al.

[11] Patent Number: 4,908,065
[45] Date of Patent: Mar. 13, 1990

[54] COATING SOLUTION FOR USE IN THE FORMATION OF METAL OXIDE FILM

[75] Inventors: Katsuya Tanitsu, Kawasaki; Muneo Nakayama, Tokyo; Yoshimi Sato, Mishima, all of Japan

[73] Assignee: Tokyo Ohka Kogyo Co., Ltd., Japan

[21] Appl. No.: 141,075

[22] Filed: Jan. 5, 1988

[30] Foreign Application Priority Data

Jan. 7, 1987 [JP] Japan .................................. 62-556

[51] Int. Cl.$^4$ ................................................. C09K 3/00
[52] U.S. Cl. ........................... 106/287.24; 106/287.18; 106/287.19; 106/287.2; 106/287.23; 544/242; 548/317; 548/571
[58] Field of Search ........... 106/287.2, 287.17, 287.18, 106/287.19, 287.23, 287.24

[56] References Cited

FOREIGN PATENT DOCUMENTS 55-149920 11/1980 Japan .................................. 544/231

*Primary Examiner*—Mary C. Lee
*Assistant Examiner*—J. Richter
*Attorney, Agent, or Firm*—Lowe, Price, LeBlanc, Becker & Shur

[57] ABSTRACT

A coating solution for use in the formation of a metal oxide film is described. It is composed of (a) a β-diketone, (b) at least one element or compound selected from the group consisting of elements capable of forming complexes with said β-diketone, salts of the elements and hydrolysates of alkoxides of the elements, and (c) an aprotic polar solvent. As an alternative, it is composed of a metal complex of a β-diketone and an aprotic polar solvent.

5 Claims, No Drawings

COATING SOLUTION FOR USE IN THE FORMATION OF METAL OXIDE FILM

FIELD OF THE INVENTION

This invention relates to a coating solution for use in the formation of a metal oxide film on a substrate through its coating and baking.

The present invention is concerned with a coating solution for use in forming, for example, (1) a metal oxide film on a substrate such as glass or ceramic substrate of a liquid crystal display or the like for the purpose of passivation, (2) a transparent conductive film on a liquid crystal display, (3) an insulating film over one or more electrodes of a semiconductor device, or (4) a film intended to improve the weatherability, corrosion resistance, chemical resistance, optical characteristics, surface strength, etc. of a ceramic, plastic, metal, or the like.

More specifically, the present invention pertains to a coating solution for use in the formation of a metal oxide film, which permits formation of a highly-uniform metal oxide film by any suitable coating method such as dipping, spin coating, spraying, roll coating or printing, is effective especially as a coating solution for roll coating, printing or the like in which high viscosity and slow dryability are required, and has high storage stability.

BACKGROUND OF THE INVENTION

The application field of metal oxide films has been diversified widely in recent years. They are being used, for example, as insulating films and orientation controlling films in liquid crystal displays, protective films for ceramics and metals, and insulating films for semiconductor devices. In particular, a liquid crystal display is fabricated by forming a patterned transparent conductive film on an insulating substrate such as glass substrate, forming a metal oxide film over the conductive film to construct an electrode substrate, arranging a pair of such electrode substrates, with such a metal oxide film formed thereon, side by side with a spacer interposed therebetween along the peripheries thereof so as to form a cell, and sealing a liquid crystal material within the cell.

As characteristics required for such metal oxide films, they are supposed to have high adhesion to insulating substrates and transparent conductive films and moreover, they should themselves be free of defects such as pinholes and should be uniform films. Since metal oxide films are used in various ways in recent years, the above-mentioned characteristics of metal oxide films must of course satisfy their individual application purposes. It is also a critical requirement that they have excellent mass producibility upon their formation. As processes known presently for the formation of a metal oxide film, may be mentioned vacuum deposition, CVD (chemical vapor deposition), sputtering, etc. However, these processes are all insufficient in mass producibility and can hardly be said to be suitable processes. For example, vacuum deposition employs a vacuum apparatus. In particular, when one wants to form a metal oxide film on a large substrate, the film thickness varies too much to obtain a uniform film. In addition, a large and expensive vacuum apparatus is indispensable so that the production cost increases. Such large metal oxide films lack mass producibility. CVD requires to heat a substrate upon formation of a metal oxide film thereon and is difficult to form a uniform film. An expensive apparatus is required for the practice of CVD. CVD is insufficient in mass producibility. On the other hand, sputtering has substantially the same drawbacks as vacuum deposition.

Coating processes have been proposed as processes which have improved the problems or drawbacks of the film-forming processes described above. In such coating processes, a coating solution for use in the formation of a metal oxide film is applied on a substrate and is then heated to form a metal oxide film. Coating processes have such advantages that a film can be formed easily irrespective of the size of a substrate and owing to simple procedures required for the formation of a film, the mass producibility is extremely high.

As a conventional coating solution known to be suitable for use in the formation of a metal oxide film by such a coating process, there is a coating solution prepared by adding polyethylene glycol or nitrocellulose to a solution composed of a metal complex of a $\beta$-diketone and as a solvent, a $\beta$-diketone-containing organic or inorganic solvent, e.g., a low-viscosity alcohol such as methanol, ethanol or propanol, a ketone such as acetone, or an ester (Japanese Patent Laid-Open No. 149920/1980). This coating solution permits easy formation of films on various substrates. However, films formed of this coating solution have high porosity. Decomposition intermediates and carbonic residues of polyethylene glycol or nitrocellulose which is contained in the coating solution may thus remain in pores even after a heat treatment applied subsequent to the coating of the solution, thereby preventing the formation of a uniform metal oxide film. Furthermore, the coating solution has poor storage stability so that a deposit occurs in the coating solution when it is left over for a long period of time.

It has heretofore been difficult to provide a coating solution which may be applied to any one of coating processes such as dip coating, spin coating, roll coating and transfer coating. A metal oxide film formed by a coating process which requires a coating solution of a relatively high viscosity is inferior in uniformity and/or poor in adherence to an insulating substrate or transparent conductive film. In order to obtain a thick metal oxide film, it is effective to apply a high-viscosity coating solution by a coating process such as roll coating or transfer printing. It is generally indispensable to incorporate a thickening agent such as organic polymer in order to prepare a high-viscosity coating solution. A coating solution with a thickening agent incorporated therein however involves such problems that the coating solution has poor storage stability and undergoes variations upon standing, thereby being gelled or developing a deposit and moreover, a metal oxide film to be formed will have low adhesion to the surface of its corresponding substrate, thereby causing peeling-off or clouding.

OBJECT AND SUMMARY OF THE INVENTION

An object of this invention is to improve the drawbacks of the conventional coating solutions for forming metal oxide films and hence to provide a coating solution for use in the formation of a metal oxide film, which has good uniformity, adhesion and strength and containing no pinholes, without being repelled by a substrate.

Another object of this invention is to provide a coating solution for use in the formation of a metal oxide film, which has excellent storage stability.

The present inventors have carried out an extensive investigation in order to attain the above objects. As a result, it has been found that (1) a liquid mixture composed of (a) a β-diketone, (b) at least one element or compound selected from the group consisting of elements capable of forming complexes with said β-diketone, salts of the elements and hydrolysates of alkoxides of the elements, and (c) an aprotic polar solvent or (2) a liquid mixture composed of a metal complex of a β-diketone and an aprotic polar solvent can provide a metal oxide film having excellent film characteristics and has superb storage stability, leading to completion of the present invention.

In one aspect of this invention, there is thus provided a coating solution for use in the formation of a metal oxide film, comprising:
  (a) a β-diketone;
  (b) at least one element or compound selected from the group consisting of elements capable of forming complexes with said β-diketone, salts of the elements and hydrolysates of alkoxides of the elements; and
  (c) an aprotic polar solvent.

In another aspect of this invention, there is also provided a coating solution for use in the formation of a metal oxide film, comprising a metal complex of a β-diketone and an aprotic polar solvent.

In a further aspect of this invention, there is also provided a process for the formation of a metal oxide film, which comprises the following consecutive steps:
  (i) coating a substrate with either one of the above coating solution; and
  (ii) subjecting the thus-coated substrate to a heat treatment at a temperature of at least 100° C.

DETAILED DESCRIPTION OF THE INVENTION

Features of the present invention will hereinafter be described in detail.

[Elements capable of forming a complex with a β-diketone]

As exemplary elements capable of forming a complex with a β-diketone, may be mentioned Group Ib elements of the periodic table such as copper; Group IIa elements of the periodic table such as beryllium, magnesium, calcium, strontium and barium; Group IIb elements of the periodic table such as zinc and cadmium; Group IIIa elements of the periodic table such as lanthanum, cerium, scandium and yttrium; Group IIIb elements of the periodic table such as aluminum, gallium, indium and thallium; Group IVa elements of the periodic table such as titanium, zirconium and hafnium; Group IVb elements of the periodic table such as silicon, germanium, tin and lead; Group Va elements of the periodic table such as vanadium, niobium and tantalum; Group Vb elements of the periodic table such as antimony and bismuth; Group VIa elements of the periodic table such as chromium, molybdenum and tungsten; Group VIb elements of the periodic table such as selenium and tellurium; Group VIIa elements of the periodic table such as manganese and rhenium; and Group VIII elements of the periodic table such as iron, cobalt and nickel. These elements may be used either singly or in combination. In addition, salts of these elements and hydrolysates of alkoxides of these elements may also be used as will be described next.

[Salts of elements]

Illustrative examples of the above salt of the element, which are useful in the practice of this invention, may include inorganic salts such as hydrochlorides, nitrates and sulfates; organic salts such as acetates and octylates; β-diketone complexes such as acetyl acetone complexes; biscyclopentadienyl complexes; etc. These salts may be used either singly or in combination.

[Hydrolysates of alkoxides of elements]

Illustrative examples of the above hydrolysate of the alkoxide of the element, which are useful in the practice of this invention, may include hydrolysates of alkoxides of at least one element belonging to any one of Groups Ib, IIa, IIb, IIIa, IIIb, IVa, IVb, Va, Vb, VIa, VIb, VIIa and VIII of the periodic table. Taking alkoxides of silicon by way of example, hydrolysates of tetraalkoxysilanes, monoalkyltrialkoxysilanes, monoaryltrialkoxysilanes and the like may be mentioned. As specific examples, may be mentioned hydrolysates of tetramethoxysilane, tetraethoxysilane, tetrapropoxysilane, tetrabutoxysilane, monomethyltrimethoxysilane, monomethyltriethoxysilane, monomethyltripropoxysilane, monomethoxytributoxysilane, monoethyltrimethoxysilane, monoethyltriethoxysilane, monophenyltrimethoxysilane, monophenyltriethoxysilane and the like. The hydrolysis of these alkoxides may be effected using, as a hydrolytic catalyst, an inorganic acid, e.g., sulfuric acid, hydrochloric acid, nitric acid or phosphoric acid, or an organic acid, e.g., monochloroacetic acid, monofluoroacetic acid or an organic sulfonic acid. For easier application, it may be recommended to use, as a coating solution, a solution which has been obtained by adding the above-described hydrolytic catalyst and a small amount of water to a liquid mixture of an alkoxide of any one of the above-mentioned elements, a β-diketone and an aprotic polar solvent and then hydrolyzing the alkoxide in the liquid mixture.

These alkoxide hydrolysates may be used either singly or in combination.

[β-Diketones]

As exemplary β-diketones useful in the practice of this invention, may be mentioned acetyl acetone, trifluoroacetyl acetone, hexafluoroacetyl acetone, benzoyl acetone, benzoyl trifluoroacetone, dibenzoylmethane, methyl acetoacetate, ethyl acetoacetate, butyl acetoacetate and so on.

The above-exemplified β-diketones may be used either singly or in combination.

[Metal complexes of β-diketones]

Illustrative examples of the metal complex of the β-diketone, which are useful in the practice of this invention, may include metal complexes of the above-exemplified elements and β-diketones. The metal complexes may each be obtained by reacting any one of the above-exemplified elements, its salt (other than the metal complexes of any one of the above-exemplified β-diketones) or a hydrolysate of any one of the above-exemplified alkoxide with the β-diketone. Such metal complexes of β-diketones may be used either singly or in combination.

[Aprotic polar solvents]

As exemplary aprotic polar solvents useful in the practice of this invention, may be mentioned N,N-dimethylformamide, N,N-dimethylacetamide, acetonitrile, dimethylsulfoxide, N,N,N',N'-tetraethylsulfamide, hexamethylphosphoramide, N-methylmorpholine, N-methylpyrrole, N-ethylpyrrole, N-methyl-$\Delta^3$-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, 1,3-dimethyltetrahydro-2-(1H)-pyrimidinone, etc. They may be used either singly or in combination. Among these aprotic polar solvents, N,N,N',N'-tetraethylsulfamide, N-methyl-2-pyrrolidone, 1,3-dimethyl-2-imidazolidinone and 1,3-dimethyl tetrahydro-2(1H)-pyrimidinone may be used preferably for their low toxicity, ready availability and easy handling.

[Preparation method of coating solutions]

Coating solutions according to this invention may each be prepared, for example, by any one of the following various methods, since a β-diketone forms a metal complex with an element, which is capable of forming a complex with the β-diketone, or a compound of the element.

(1) At least one element or compound (b), which is selected from the group consisting of elements capable of forming complexes with said β-diketone, salts of the elements and hydrolysates of alkoxides of the elements, is dissolved in a liquid mixture composed of (a) a β-diketone and (c) an aprotic polar solvent.

(2) A metal complex of a β-diketone is dissolved in a liquid mixture composed of the β-diketone and an aprotic polar solvent.

(3) A metal complex of a β-diketone is dissolved in an aprotic polar solvent.

(4) A hydrolytic catalyst and a small amount of water are added to a liquid mixture containing an alkoxide of any one of the above elements, a βdiketone and an aprotic polar solvent, followed by hydrolysis of the alkoxide in the liquid mixture to prepare a coating solution.

[Proportions of components]

As proportions of the above components (a), (b) and (c) in a coating solution according to this invention, the components (a), (b) and (c) may be 1 wt. %–60 wt. %, 1 wt. %–60 wt. % and 10 wt. %–80 wt. %, preferably, 1 wt. %–50 wt. %, 1 wt. %–50 wt. % and 10 wt. %–70 wt. %, respectively, in the preparation method (1).

In the preparation method (2) or (3) where the metal complex of the βdiketone is used instead of the components (a) and (b), the metal complex of the βdiketone may preferably be used in a proportion of 1 wt.%–60 wt. while the preferably proportion of the component (c) is 40 wt.%–99 wt.%.

In the preparation method (4), the proportions of the alkoxide, βdiketone and aprotic polar solvent are the same as those give above with respect to the preparation method (1). [Organic solvents]

An organic solvent may be added as desired to a coating solution of this invention in order to improve it film-forming characteristics. Organic solvents, which are usable in the present invention, may preferably be those represented by any one of the following general formulae:

HO—R—OH;

HO—R—O—R;

HO—R—O—R—OH;

HO—R—O—R—O—R; and

R—O—R—O—R—O—R wherein Rs mean independently an alkyl, alkylene, aryl, arylene or benzyl group. As specific examples, may be mentioned methyl alcohol, ethyl alcohol, isopropyl alcohol, n-propyl alcohol, n-butyl alcohol, ethylene glycol, propylene glycol, butylene glycol, hexylene glycol, octylene glycol, diethylene glycol, dipropylene glycol, dihexylene glycol, ethylene glycol monomethyl ether, ethylene glycol monoethyl ether, ethylene glycol monobutyl ether, ethylene glycol monopropyl ether, ethylene glycol monophenyl ether, ethylene glycol monobenzyl ether, propylene glycol monomethyl ether, propylene glycol monoethyl ether, propylene glycol monobutyl ether, ethylene glycol dimethyl ether, ethylene glycol diethyl ether, ethylene glycol methyl ethyl diether, ethylene glycol dibutyl ether, ethylene glycol dipropyl ether, ethylene glycol diphenyl ether, ethylene glycol dibenzyl ether, propylene glycol dimethyl ether, propylene glycol diethyl ether, propylene glycol dibuthyl ether, methylcarbitol, ethylcarbitol, butylcarbitol, phenylcarbitol, benzylcarbitol, dimethylcarbitol, diethylcarbitol, dibutylcarbitol, diphenylcarbitol, dibenzylcarbitol, methylethylcarbitol, dipropylene glycol dimethyl ether, dipropylene glycol diethyl ether, dipropylene glycol dibutyl ether, etc.

These organic solvents may be used either singly or in combination. The organic solvent may be added preferably in an amount not greater than 80 wt. % based on the liquid mixture of the components (a), (b) and (c) or the liquid mixture of the metal complex of the β-diketone and the aprotic polar solvent, with a range of 30–70 wt. % being particularly preferred. An addition of the organic solvent in an unduly large amount will lead to a coating solution reduced in coatability and also to a coating film reduced in both adhesion and strength. It is therefore not preferable to add the organic solvent too much.

[Coating method and method for the formation of metal oxide film]

Coating solutions according to this invention can each form a metal oxide film excellent in adhesion and uniformity on a substrate, such as plastic substrate, glass substrate, ceramic substrate, or substrate obtained by sintering powder of a metal nitride, metal carbonate and/or the like, metal substrate or substrate for a semiconductor when it is applied on the substrate and thereafter heated. Any suitable coating method may be used, such as dip coating, spray coating, spin coating, brush coating, roll coating or printing. It is preferable to use a printing method in view of the efficiency of work especially when one wants to form a pattern with a metal oxide film.

As an exemplary heating method, may be mentioned hot plate heating, hot air heating, burner heating, infrared ray heating, laser heating, high-frequency wave heating or the like. Regarding the heating temperature, it is preferable to conduct the heating at a temperature of at least 100° C., preferably, 300° C. or higher from the viewpoint of forming a chemically-stable film. It is however necessary to choose the heating temperature suitably within a temperature range which a substrate to be coated will be able to withstand, since there are some substrates having limited heat resistance due to their materials.

ADVANTAGES

A coating solution of this invention is excellent in storage stability and can provide a metal oxide film having excellent properties, i.e., having good uniformity, adhesion and strength and containing no pinholes, without being repelled by a substrate. The present invention can therefore provide film-coated substrates and the like with good mass producibility, thereby bringing about a significant advantage from the industrial viewpoint.

EMBODIMENTS OF THE INVENTION

The present invention will hereinafter be described specifically by the following Examples and Comparative Examples. Needless to say, the present invention is not necessarily limited to the following Examples only. Incidentally, all designations of "part" or "parts" will mean part or parts by weight.

Example 1:

After washing a soda glass substrate of 1.1 mm thick, it was dipped in a coating solution composed of the following components and then pulled out at a constant rate of 10 cm/min so as to perform its coating.

| (Composition of the coating solution) | |
| --- | --- |
| Ethyl acetoacetate aluminum diisopropylate | 15 parts |
| Acetyl acetone | 3 parts |
| N—methyl-2-pyrrolidone | 25 parts |

The thus-coated substrate was thereafter placed in a recirculating hot dryer, in which it was dried at 140° C. for 1 minutes. It was then transferred into an electric furnace, where it was baked at 500° C. for 60 minutes to form an $Al_2O_3$ film of 80 nm thick. The thus-obtained film was transparent, was free of any appreciable pinholes, had high uniformity and was good in both adhesion and strength. In addition, the coating solution did not develop any change in components and remained uniform even after stored for 12 months. An additional coating test was performed in the same manner, using the coating solution which had been stored over 12 months. No substantial differences were observed in rating between a film thus formed and the film formed 12 months ago.

EXAMPLE 2:

A 5-inch silicon wafer was spin-coated at 3,000 rpm with a coating solution which had been obtained by mixing the following components thoroughly and then hydrolyzing the tetraethoxysilane.

| (Composition of the coating solution) | |
| --- | --- |
| Tetraethoxysilane | 40 parts |
| Acetyl acetone | 57 parts |
| N—Methyl-2-pyrrolidone | 50 parts |
| Purified water | 7 parts |
| Phosphoric acid (hydrolytic catalyst) | 0.1 part |

After drying the thus-coated wafer at 200° C. for 10 minutes on a hot plate, it was transferred into an electric furnace and then baked at 800° C. for 30 minutes, thereby to obtain a PSG (silicon oxide) film of 120 nm thick. The film was good in uniformity, adhesion and strength. Neither pinholes noticeable to the eye nor film irregularity caused due to repelling of the coating solution by the substrate upon coating were observed. Further, the coating solution did not develop any change in components and remained uniform even after stored at room temperature for 12 months. An additional coating test was performed in the same manner, using the coating solution which had been stored over 12 months. No substantial differences were observed in rating between a film thus formed and the film formed 12 months ago.

EXAMPLE 3:

After washing a borosilicate glass substrate of 1.1 mm thick, it was subjected to transfer printing with a coating solution composed of the following components.

| (Composition of the coating solution) | |
| --- | --- |
| Serium(III) nitrate | 40 parts |
| Acetyl acetone | 28 parts |
| 1,3-Dimethyl-2-imidazolidinone | 20 parts |

Drying of the thus-coated substrate was effected at 200° C. for 10 minutes in a conveyor-equipped electric furnace immediately after the transfer printing. The thus-dried substrate was thereafter baked at 600° C. for 60 minutes, thereby forming a $Ce_2O_3$ film of 65 nm thick. Neither pinholes noticeable to the eye nor film irregularity caused due to repelling of the coating solution by the substrate upon coating were observed on the film. The film was also good in both adhesion and strength. Further, the coating solution did not develop any change in components and remained uniform even after stored at room temperature for 12 months. In addition, a similar coating test was performed using the coating solution which had been stored over 12 months. No substantial differences were observed in rating between a film thus formed and the film formed 12 months ago.

EXAMPLE 4:

After washing a metal aluminum substrate of 1.0 mm thick, it was coated with a coating solution composed of the following components by the roll-coating method.

| (Composition of the coating solution) | |
| --- | --- |
| Iron(III) acetyl acetonate | 25 parts |
| Hexamethylphosphoramide | 20 parts |
| Ethyl alcohol | 5 parts |

Drying of the thus-coated substrate was effected at 140° C. for 15 minutes in a recirculating hot air dryer immediately after the roll coating. The thus-dried substrate was thereafter transferred into an electric furnace, where it was baked at 300° C. for 60 minutes, thereby forming an $Fe_2O_3$ film of 56 nm thick. Neither pinholes noticeable to the eye nor film irregularity caused due to repelling of the coating solution by the substrate upon coating were observed on the film. The film was also good in both adhesion and strength. Further, the coating solution did not develop any change in components and remained uniform even after stored at room temperature for 12 months. In addition, a similar coating test was performed using the coating solution which had been stored over 12 months. No substantial differences were observed in rating between a film thus formed and the film formed 12 months ago.

EXAMPLE 5:

After washing a ceramic substrate of 1.0 mm thick, it was spin-coated at 1,000 rpm with a coating solution composed of the following components.

| (Composition of the coating solution) | |
|---|---|
| Dibutyltin diacetate | 5 parts |
| Ethyl acetoacetate | 1.9 parts |
| Tin(II) trifluoroacetylacetonate | 12 parts |
| Dimethylsulfoxide | 60 parts |
| Propylene glycol | 40 parts |
| Ethyl alcohol | 20 parts |

After the spin coating, the thus-coated substrate was dried at 100° C. for 10 minutes in a recirculating hot air dryer. The thus-dried substrate was thereafter transferred into an electric furnace, where it was baked at 700° C for 60 minutes, thereby forming an SnO film of 68 nm thick. The film has a sheet resistance of 8.3 k$\Omega$/□. Neither pinholes noticeable to the eye nor film irregularity caused due to repelling of the coating solution by the substrate upon coating were observed. The film was also good in both adhesion and strength. Further, the coating solution did not develop any change in components and remained uniform even after stored at room temperature for 12 months. In addition, a similar coating test was performed using the coating solution which had been stored over 12 months. No substantial differences were observed in rating between a film thus formed and the film formed 12 months ago.

Example 6:

Following the procedure of Example 1, a soda glass substrate was coated with a coating solution composed of the following components, followed by its drying and baking.

| (Composition of the coating solution) | |
|---|---|
| Pentaethoxy tantalum | 15 parts |
| Nickel(II) nitrate | 50 parts |
| Acetyl acetone | 45 parts |
| 1,3-Dimethyltetrahydro-2(1H)-pyrimidine | 30 parts |
| Ethylene glycol monobutyl ether | 30 parts |

A $Ta_2O_5$-NiO base film having a thickness of 128 nm was formed on the substrate. Neither pinholes noticeable to the eye nor film irregularity caused due to repelling of the coating solution by the substrate upon coating were observed on the film. The film was also good in both adhesion and strength. Further, the coating solution did not develop any change in components and remained uniform even after stored at room temperature for 12 months. In addition, a similar coating test was performed using the coating solution which had been stored over 12 months. No substantial differences were observed in rating between a film thus formed and the film formed 12 months ago.

EXAMPLE 7:

After washing a soda glass substrate of 1.1 mm thick, its coating was conducted by dipped it in a coating solution, which had been obtained by mixing the following components thoroughly and then hydrolyzing the tetraethoxysilane, and thereafter pulling it out of the coating solution at a constant rate of 30 cm/min.

| (Composition of the coating solution) | |
|---|---|
| Tetraethoxysilane | 30 parts |
| Monomethyltriethoxysilane | 10 parts |
| 1,3-Dimethyl-2-imidazolidinone | 50 parts |
| Acetyl acetone | 54 parts |
| Purified water | 9.1 parts |
| Hydrochloric acid (hydrolytic catalyst) | 0.1 part |

After placing the thus-coated substrate in a recirculating hot air dryer and drying same at 140° C. for 15 minutes, it was transferred into an electric furnace and then baked at 450° C. for 60 minutes there, thereby to obtain a silica-type oxide film of 180 nm thick.

The film was transparent. Pinholes noticeable to the eye were not observed. The film had high uniformity and was good in both adhesion and strength. The coating solution did not develop any change in components and remained uniform even after stored at room temperature for 12 months.

An additional coating test was performed in the same manner, using the coating solution which had been stored over 12 months. No substantial differences were observed in rating between a film thus formed and the film formed 12 months ago.

Comparative Example 1:

A 5-inch silicon wafer was spin-coated at 3,000 rpm with a coating solution which had been obtained by mixing the following components thoroughly and then hydrolyzing the tetraethoxysilane.

| (Composition of the coating solution) | |
|---|---|
| Tetraethoxysilane | 40 parts |
| N—Methyl-2-pyrrolidone | 30 parts |
| Ethylene glycol monoethyl ether | 60 parts |
| Purified water | 7 parts |
| Phosphoric acid (hydrolytic catalyst) | 0.1 part |

After drying the thus-coated wafer at 200° C. for 10 minutes on a hot plate, it was transferred into an electric furnace and then baked at 800° C. for 30 minutes, thereby to obtain a PSG (silicon oxide) film of 135 nm thick. The film was good in uniformity, adhesion and strength. After the coating solution was stored at room temperature for 1 week, it was however converted into a gel-like mixture of a milky white color and was no longer usable as a coating solution.

COMPARATIVE EXAMPLE 2:

After washing a soda glass substrate of 1.1 mm thick, it was dipped in a coating solution composed of the following components and then pulled out at a constant rate of 10 cm/min so as to perform its coating.

| (Composition of the coating solution) | |
|---|---|
| Triisopropoxy aluminum | 10 parts |
| Isopropyl alcohol | 60 parts |
| Dimethylformamide | 20 parts |

After pulling out the soda glass substrate, it was dried at 100° C. for 10 minutes in a recirculating hot dryer. The film became cloudy and fogging was observed all over the film. In addition, deposit of a white precipitate was observed in about 2 weeks when the coating solution was left over at room temperature.

What is claimed is:

1. A coating solution for use in the formation of a metal oxide film, comprising:
    (a) a β-diketone;
    (b) at least one element or compound selected from the group consisting of elements capable of forming complexes with said β-diketone, salts of the elements and hydrolysates of alkoxides of the elements; and
    (c) an aprotic polar solvent.

2. The coating solution as claimed in claim 1, wherein said hydrolysates have each been obtained by adding a hydrolytic catalyst and a small amount of water to a liquid mixture which contains its corresponding alkoxide and the β-diketone and aprotic polar solvent, and then hydrolyzing the alkoxide in the liquid mixture.

3. A coating solution for use in the formation of a metal oxide film, comprising:
    (a) a β-diketone;
    (b) at least one element or compound selected from the group consisting of elements capable of forming complexes with said β-diketone, salts of the elements and hydrolysates of alkoxides of the elements; and
    (c) at least one aprotic polar solvent selected from N,N,N',N'-tetraethylsulfamide, N-methyl-2-pyrrolidone, 1,3-dimethyl-2-imidazolidinone and 1,3-dimethyltetrahydro-2(1H)-pyrimidine.

4. A coating solution for use in the formation of a metal oxide film, comprising:
    (a) a β-diketone;
    (b) a metal complex of the same βdiketone as the first-mentioned βdiketone (a); and
    (c) an aprotic polar solvent.

5. A coating solution for use in the formation of a metal oxide film, comprising a metal complex of a βdiketone and an aprotic polar solvent.

* * * * *